US008446504B2

(12) United States Patent
Taruki et al.

(10) Patent No.: US 8,446,504 B2
(45) Date of Patent: May 21, 2013

(54) SOLID-STATE IMAGING DEVICE INCLUDING A PIXEL DRIVING CIRCUIT

(75) Inventors: Hisayuki Taruki, Kanagawa (JP); Nagataka Tanaka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 226 days.

(21) Appl. No.: 13/052,182

(22) Filed: Mar. 21, 2011

(65) Prior Publication Data
US 2011/0234871 A1 Sep. 29, 2011

(30) Foreign Application Priority Data
Mar. 24, 2010 (JP) ................................. 2010-068766

(51) Int. Cl.
*H04N 3/14* (2006.01)
*H04N 5/335* (2011.01)

(52) U.S. Cl.
USPC ....................................................... 348/300

(58) Field of Classification Search
USPC .................................. 348/300, 301
See application file for complete search history.

(56) References Cited

U.S. PATENT DOCUMENTS

| 6,946,636 | B2 * | 9/2005 | Eguchi et al. | 250/208.1 |
| 7,719,583 | B1 * | 5/2010 | Lee et al. | 348/294 |
| 2005/0248674 | A1 * | 11/2005 | Mabuchi et al. | 348/308 |
| 2007/0103574 | A1 | 5/2007 | Tanaka | |
| 2010/0066879 | A1 | 3/2010 | Tanaka | |

FOREIGN PATENT DOCUMENTS

JP 2007-124344 5/2007

* cited by examiner

*Primary Examiner* — Albert Cutler
(74) *Attorney, Agent, or Firm* — Oblon, Spivak, McClelland, Maier & Neustadt, L.L.P.

(57) ABSTRACT

According to one embodiment, the pixel driving circuit causes the amplifying transistor to form a source follower circuit without applying a bias voltage to the vertical signal line and connects the FD to the power source. Thereafter, the pixel driving circuit separates the current source from the vertical signal line to cancel the source follower circuit, applies a bias voltage to the vertical signal line so that the voltage of the FD is raised when the brightness of the subject is higher than the reference value, and the voltage of the FD is lowered when the brightness of the subject is lower than the reference value, and turns on the read transistor. The pixel driving circuit turns off the read transistor, and then connects the current source to the vertical signal line, and causes the amplifying transistor to form the source follower circuit.

9 Claims, 6 Drawing Sheets

US 8,446,504 B2

SOLID-STATE IMAGING DEVICE INCLUDING A PIXEL DRIVING CIRCUIT

CROSS-REFERENCE TO RELATED APPLICATIONS

This application is based upon and claims the benefit of priority from the prior Japanese Patent Application No, 2010-068766, filed on Mar. 24, 2010; the entire contents of which are incorporated herein by reference.

FIELD

Embodiments described herein relate generally to a solid-state imaging device.

BACKGROUND

A unit pixel included in a pixel array of a CMOS image sensor, which is a typical example of a solid-state imaging device, includes a photodiode that performs photoelectric conversion, a read transistor that reads a signal charge converted and accumulated in the photodiode to a floating diffusion (floating diffusion layer, hereinafter referred to as "FD") which functions as a capacity element, a reset transistor that sets a voltage of the FD to a power source voltage, and an amplifying transistor that converts the voltage of the FD into a pixel signal when forming a source follower circuit by using a current source connected to a vertical signal line and outputs the pixel signal to the vertical signal line.

By the way, in recent years, miniaturization of the unit pixel has advanced due to a request to increase the number of pixels or reduce the size of optical system. As the pixel size reduces, a case occurs in which the charge accumulation capacity (dynamic range) of the FD is not sufficient with respect to the converted signal charge amount of the photodiode depending on the brightness (illumination intensity) of the subject, and there is a problem that all the signal charge converted and accumulated in the photodiode may not be read to the FD.

DETAILED DESCRIPTION

Figure 1:
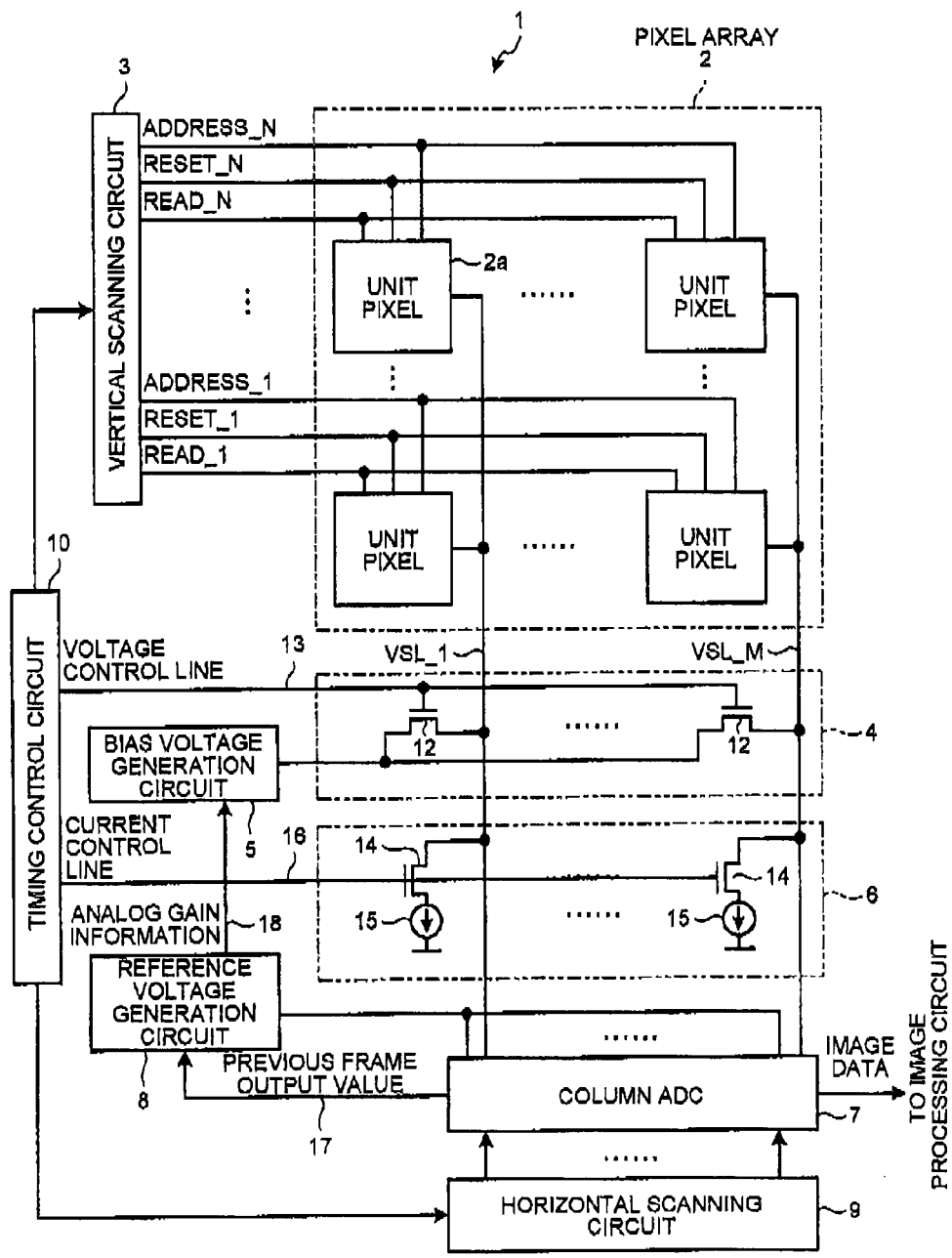
FIG. 1 is a block diagram illustrating a main configuration of a solid-state imaging device according to an embodiment.

In general, according to one embodiment, a solid-state imaging device includes a pixel array in which a plurality of unit pixels are arranged in row and column directions. Each of the unit pixel includes a photodiode configured to perform photoelectric conversion, a read transistor configured to read a signal charge converted and accumulated in the photodiode to a floating diffusion, a reset transistor configured to set a voltage of the floating diffusion to a power source voltage, and an amplifying transistor in which the voltage of the floating diffusion is applied to a gate terminal and a power source voltage is applied to a power source terminal when a row of the unit pixel is selected. Further, the solid-state imaging device includes a plurality of vertical signal lines that are respectively arranged to columns of the pixel array and respectively connected to an output terminal of the amplifying transistor of each unit pixel in the column direction, a bias voltage generation circuit configured to generate a bias voltage applied to each of the plurality of vertical signal lines via a first switch, a plurality of current sources respectively connected between each of the plurality of vertical signal lines and a circuit ground via a second switch, and a pixel driving circuit configured to cause the amplifying transistor to form a source follower circuit. The pixel driving circuit causes the bias voltage generation circuit to generate a bias voltage which is raised or lowered according to brightness of a subject.

Exemplary embodiments of a solid-state imaging device will be explained below in detail with reference to the accompanying drawings. The present invention is not limited to the following embodiments.

According to an embodiment, a pixel driving circuit, which uniformly drives and controls unit pixels in a row of the pixel array, causes an amplifying transistor to form a source follower circuit without applying a bias voltage to a vertical signal line from a bias voltage generation circuit, turns on a reset transistor, and connects a floating diffusion to a power source. A pixel signal (reset voltage) is transmitted from the floating diffusion to the vertical signal line. Thereafter, the pixel driving circuit separates a current source from the vertical signal line to cancel the source follower circuit, and applies a bias voltage from a bias voltage generation circuit to the vertical signal line so that the voltage of the floating diffusion is raised when the brightness of the subject is higher than a reference value, and the voltage of the floating diffusion is lowered when the brightness of the subject is lower than the reference value. The bias voltage is a voltage higher than the reset voltage of the vertical signal line when the brightness is higher than the reference value, and a voltage lower than the reset voltage of the vertical signal line when the brightness is lower than the reference value. In this state, a read transistor is turned on and an accumulated signal charge in a photodiode is read to the floating diffusion. The pixel driving circuit turns off the read transistor, and then connects the current source to the vertical signal line, and causes the amplifying transistor to form the source follower circuit. A pixel signal (reset voltage signal voltage) is transmitted from the floating diffusion to the vertical signal line.

Hereinafter, a solid-state imaging device according to an embodiment will be described in detail with reference to the attached drawings. The embodiment does not limit the present invention.

Figure 2:
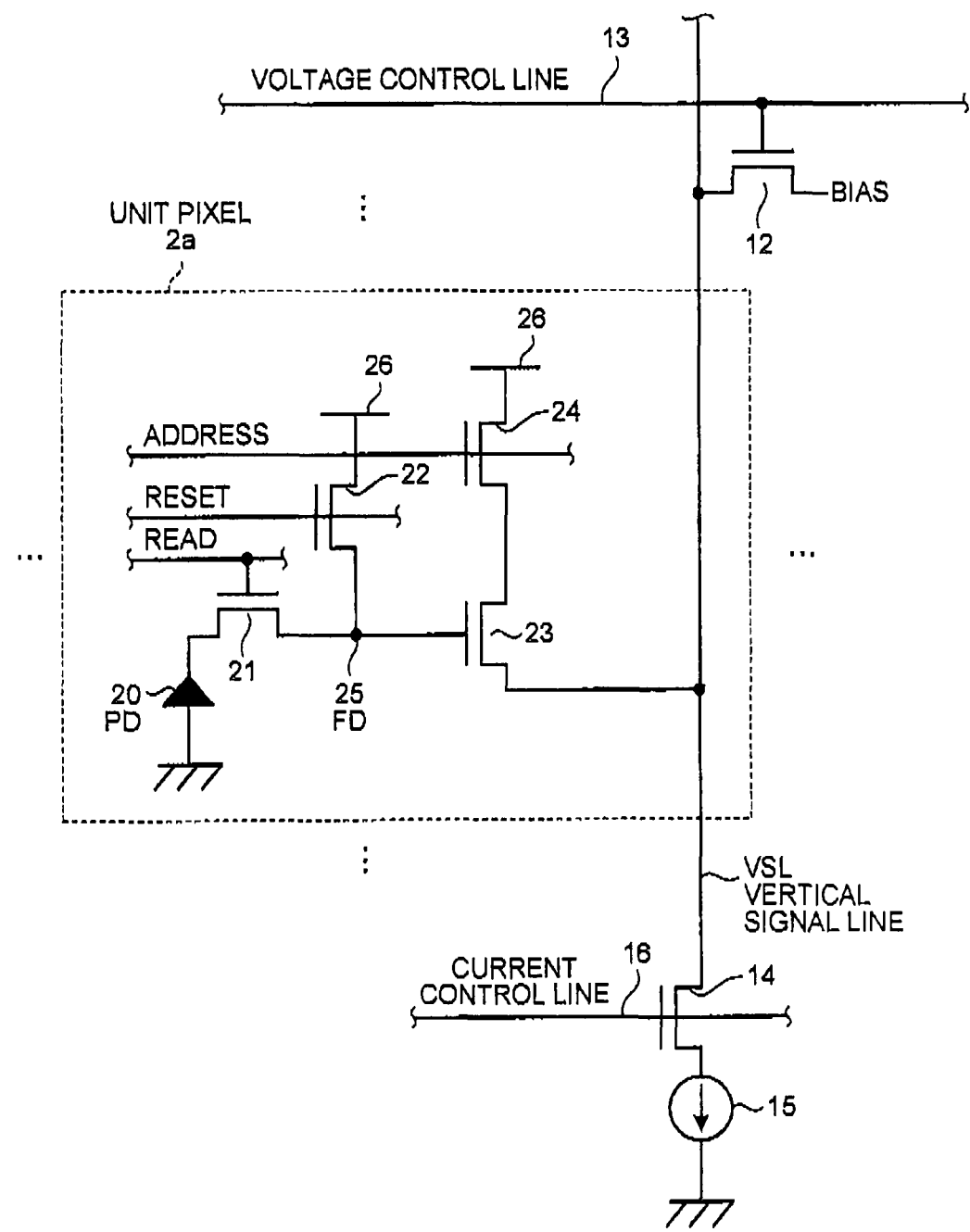
FIG. 2 is an equivalent circuit diagram illustrating a configuration of a unit pixel.

FIG. 1 is a block diagram illustrating a main configuration of a solid-state imaging device according to an embodiment. FIG. 2 is an equivalent circuit diagram illustrating a configuration of a unit pixel.

In FIG. 1, a solid-state imaging device (CMOS image sensor) 1 includes a pixel array 2, a vertical scanning circuit 3, a bias control circuit 4, a bias voltage generation circuit 5, a current control circuit 6, a column ADC 7, a reference voltage generation circuit 8, a horizontal scanning circuit 9, and a timing control circuit 10.

In the pixel array 2, a plurality of unit pixels 2a are arranged in an array of N rows and M columns, and M vertical signal lines VSL-1 to VSL-M, which are connected in parallel and to each of which output terminals of one column of unit pixels 2a are connected, are respectively provided for each column. Between the pixel array 2 and the vertical scanning circuit 3, N address signal lines ADDRESS_1 to ADDRESS_N, N reset signal lines RESET_1 to RESET_N, and N read signal lines READ_1 to READ_N, which are respectively connected to input terminals of one row of unit pixels 2a in parallel for each row, are provided.

The vertical scanning circuit 3 sequentially selects and derives the address signal lines ADDRESS_1 to ADDRESS_N at a timing specified from the timing control circuit 10 to sequentially select each row in the pixel array 2, individually controls the address signal line ADDRESS, the reset signal line RESET, and the read signal line READ in the selected one row, and operates the unit pixels 2a in one row.

The bias control circuit 4 includes M switch transistors 12 whose source terminals are respectively connected to the vertical signal lines VSL-1 to VSL-M. The drain terminals of the M switch transistors 12 are connected in parallel to an output terminal of the bias voltage generation circuit 5, and the gate terminals are connected in parallel to a voltage control line 13 controlled by the timing control circuit 10. Here, NMOS transistors are used as the switch transistors 12, and the switch transistors 12 are controlled to be ON or OFF by a voltage of the voltage control line 13. During the ON period, the switch transistors 12 apply a bias voltage output from the bias voltage generation circuit 5 to a corresponding vertical signal line VSL. Thus, the M switch transistors 12 correspond to a plurality of first switches.

The current control circuit 6 includes M switch transistors 14 whose drain terminals are respectively connected to the vertical signal lines VSL-1 to VSL-M and M current sources 15 respectively connected between the M switch transistors 14 and the circuit ground. The gate terminals of the M switch transistors 14 are connected in parallel to a current control line 16 controlled by the timing control circuit 10. Here, NMOS transistors are used as the switch transistors 14, and the switch transistors 14 are controlled to be ON or OFF by a voltage of the current control line 16. During the ON period, the switch transistors 14 connect a corresponding current source 15 to a corresponding vertical signal line VSL. Thus, the M switch transistors 14 correspond to a plurality of second switches.

In the column ADC 7, comparators and ADC units which perform Correlated Double Sampling (CDS) processing and AD conversion processing are arranged in a one-to-one relationship with the vertical signal lines VSL-1 to VSL-M. One input of each comparator is a pixel signal (reset voltage, reset voltage+converted signal voltage) from the vertical signal line VSL, and the other input is two reference signals (triangle wave signals) sequentially output from the reference voltage generation circuit 8. As an implementation method of the CDS processing, there are an analog method and a digital method, and the configuration of the ADC units varies depending on the implementation method. Each ADC unit includes a memory for holding a converted digital value. Each memory sequentially outputs the held digital value to an image processing circuit as image data in accordance with a column selection signal output from the horizontal scanning circuit 9 at a timing specified by the timing control circuit 10, and also outputs an output value 17 in a previous frame to the reference voltage generation circuit 8. When the brightness of the subject is low, an amplitude value indicated by the previous frame output value 17 is small, and when the brightness is high, the amplitude value is large.

The reference voltage generation circuit 8 sequentially generates two triangle wave signals whose amplitude increases step-by-step or linearly and outputs the triangle wave signals. The triangle wave signal generated first is for the "reset voltage" output from the unit pixel 2a to the vertical signal line VSL, and the triangle wave signal generated next is for the "reset voltage+converted signal voltage" output from the unit pixel 2a to the vertical signal line VSL. The reference voltage generation circuit 8 generates the second triangle wave signal by using the previous frame output value 17 from the column ADC 7 as an initial value. Based on this, the ADC unit of the column ADC 7 can obtain the same effect as operating with an analog gain which increases an input level when the brightness of the subject is lower than a reference value and decreases the input level when the brightness of the subject is higher than the reference value. The reference voltage generation circuit 8 calculates such an analog gain from the previous frame output value 17, and outputs the calculated analog gain information 18 which fluctuates according to the brightness of the subject to the bias voltage generation circuit 5.

On the basis of the analog gain information 18, the bias voltage generation circuit 5 generates a bias voltage lower than a predetermined value when the analog gain is greater than a reference value, that is, when the brightness of the subject is lower than a reference value. On the other hand, the bias voltage generation circuit 5 generates a bias voltage higher than the predetermined value when the analog gain is smaller than the reference value, that is, when the brightness of the subject is higher than the reference value. The "predetermined value" is a voltage value of the vertical signal line VSL when the unit pixel 2a is reset.

Next, a configuration of the unit pixel 2a will be described with reference to FIG. 2. The unit pixel 2a includes a photodiode (ED) 20, a read transistor 21, a reset transistor 22, an amplifying transistor 23, an address transistor 24, and a floating diffusion (FD) 25. Here, NMOS transistors are used for the transistors 21 to 24.

The photodiode 20 photoelectrically converts incident light into an amount of signal charge according to the amount of the incident light and accumulates the amount of signal charge. The anode terminal of the photodiode 20 is connected to the circuit ground. The read transistor 21 is disposed between the cathode terminal of the photodiode 20 and the FD 25. The read transistor 21 is controlled to be ON or OFF by a voltage of the read line READ connected to the gate terminal. During the ON period of the read transistor 21, the read transistor 21 reads the signal charge which is converted and accumulated in the photodiode 20 to the FD 25.

In the reset transistor 22, the drain terminal is connected to a power source (voltage VDD) 26, the source terminal is connected to the FD 25, and the gate terminal is connected to the reset line RESET. The reset transistor 22 is controlled to be ON or OFF by a voltage of the reset line RESET, and during the ON period, the reset transistor 22 sets the voltage of the FD 25 to the voltage VDD of the power source 26.

In the address transistor 24, the drain terminal is connected to the power source (voltage VDD) 26, the source terminal is connected to the drain terminal of the amplifying transistor 23, and the gate terminal is connected to the address line ADDRESS. The address transistor 24 is controlled to be ON or OFF by a voltage of the address line ADDRESS which selects a row, and during a period when the row is selected and the address transistor 24 is turned ON, the address transistor 24 connects the drain terminal of the amplifying transistor 23 to the power source 26.

In the amplifying transistor 23, the source terminal is connected to the vertical signal line VSL and the gate terminal is connected to the FD 25. The amplifying transistor 23 forms a source follower circuit when the address transistor 24 is selected and turned ON and the drain terminal of the amplifying transistor 23 is connected to the power source 26 and at the same time the switch transistor 14 is turned ON and the current source 15 is connected to the source terminal of the amplifying transistor 23 via the vertical signal line VSL. During a period when the amplifying transistor 23 forms a source follower circuit, the amplifying transistor 23 converts the voltage of the FD 25 that has been reset by the reset transistor 22 into the same level pixel signal and outputs the pixel signal to the vertical signal line VSL, and further converts the voltage (reset voltage+converted signal voltage) of the FD 25 to which the signal charge has been read from the photodiode 20 by the read transistor 21 into the same level pixel signal and outputs the pixel signal to the vertical signal line VSL.

In the above configuration, the vertical scanning circuit 3, the bias control circuit 4, the current control circuit 6, the reference voltage generation circuit 8, the voltage control line 13, the current control line 16, and the timing control circuit 10 configure a pixel driving circuit as a whole. Hereinafter, an operation of the pixel driving circuit according to this embodiment, specifically an operation when the signal charge converted and accumulated in the photodiode 20 is read to the FD 25 will be described with reference to FIGS. 3 to 10.

The capacity value C of the FD 25 that functions as a capacity element is known as a design value, so that a signal charge amount Qfd that can be accumulated when a constant power source voltage VDD is applied is a constant value given by Qfd=CV. On the other hand, a signal charge amount Qpd converted and accumulated in the photodiode 20 increases or decreases in proportion to the amount of light.

Therefore, in this embodiment, the amount of light when Qpd=Qfd is true is defined as a reference light amount, and when the amount of actual incident light is greater than the reference light amount, an operation example 1 (FIG. 3) which raises the voltage of the FD 25 is performed because the dynamic range is not sufficient, and when the amount of actual incident light is smaller than the reference light amount, an operation example 2 (FIG. 5) which lowers the voltage of the FD 25 is performed because the dynamic range is sufficient.

OPERATION EXAMPLE 1

Figure 3:
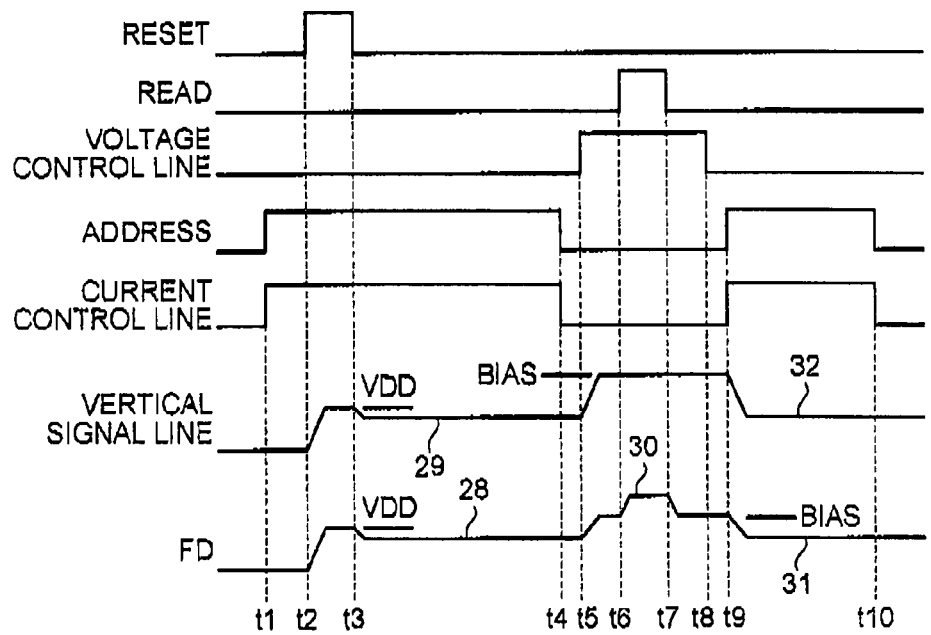
FIG. 3 is a timing chart diagram for explaining a read operation (No. 1) of a converted signal charge to a floating diffusion in a unit pixel.
Figure 4:
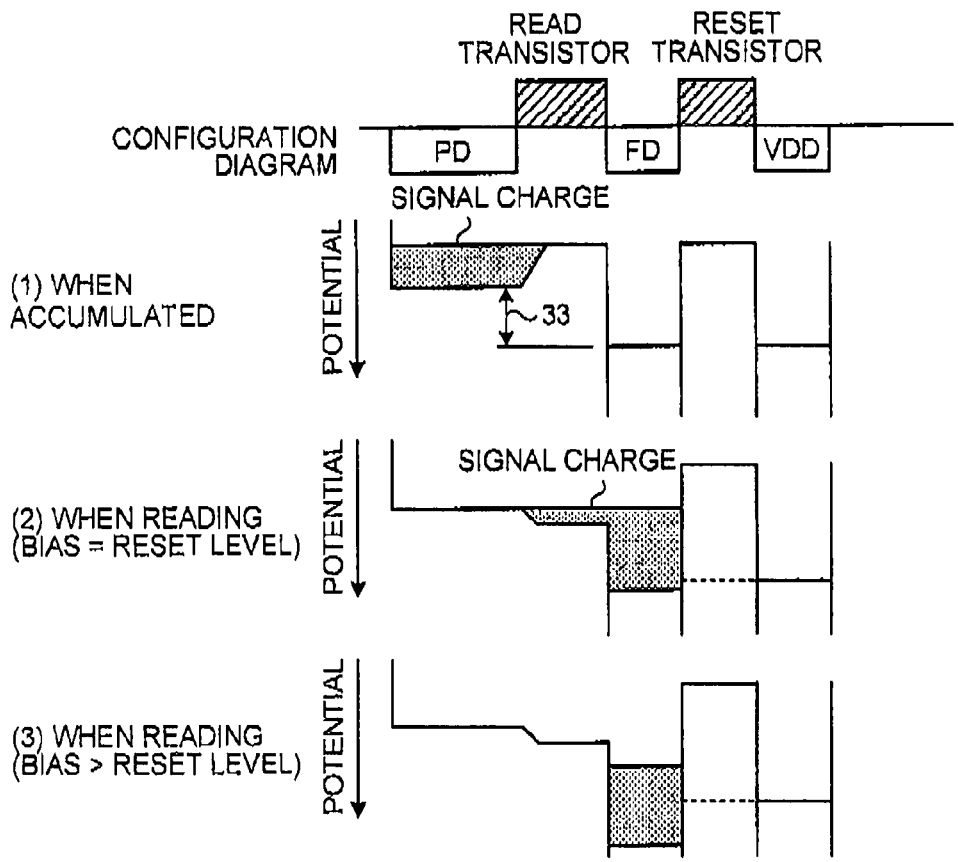
FIG. 4 is a potential diagram for explaining a voltage raising effect of the floating diffusion.

FIG. 3 is a timing chart diagram for explaining a read operation (No. 1) of a' converted signal charge to the floating diffusion in a unit pixel. FIG. 4 is a potential diagram for explaining a voltage raising effect of the floating diffusion.

In FIG. 3, at time t1, the ADDRESS line and the current control line 16 are raised to high level at the same time. In the unit pixel 2a, the drain terminal of the amplifying transistor 23 is connected to the power source 26 via the address transistor 24 and the source terminal of the amplifying transistor 23 is connected to the current source 15 via the vertical signal line VSL and the switch transistor 14, so that the amplifying transistor 23 forms a source follower circuit. However, the voltage of the FD 25 at this time is lower than or equal to a threshold value of the amplifying transistor 23, the amplifying transistor 23 is in a standby state for the start of the operation of the source follower circuit.

Thereafter, at time t2, the RESET line is raised to high level while the READ line is held at low level. At time t2, the voltage control line 13 is also low level, so that a bias voltage is not applied to the vertical signal line VSL. In the unit pixel 2a, while the read transistor 21 is turned off, the reset transistor 22 is turned on and the power source 26 is connected to the FD 25. In the period from time t2 to time t3 in which the RESET line is high level, the voltage of the FD 25 is raised toward the voltage VDD of the power source 26 and becomes the voltage VDD. In this way, the amplifying transistor 23 is turned on and performs the source follower circuit operation, so that the voltage of the vertical signal line VSL becomes a voltage near the voltage VDD.

At time t3 when the RESET line becomes low level, if the reset transistor 22 is turned off, the voltage of the FD 25 settles to a dark-time level 28 slightly lower than the voltage VDD. Also, the voltage of the vertical signal line VSL settles to a reset level 29 slightly lower than the voltage near the voltage VDD. An image signal at the reset level 29 is input into the column ADC 7. The bias voltage generated by the bias voltage generation circuit 5 is a voltage higher than the reset level 29 that is the "predetermined value".

At time t4 when the voltage of the FD 25 settles to the dark-time level 28 and the voltage of the vertical signal line VSL settles to the reset level 29, the ADDRESS line and the current control line 16 fall to low level at the same time. In the unit pixel 2a, although the amplifying transistor 23 is turned on, the address transistor 24 is turned off due to selection cancellation. Thus the drain terminal of the amplifying transistor 23 is disconnected from the power source. Further, the switch transistor 14 is turned off, so that the vertical signal line VSL is disconnected from the current source 15 and becomes a floating state. In other words, the amplifying transistor 23 is only connected to the vertical signal line VSL whose source terminal is in a floating state, so that the amplifying transistor 23 does not perform the operation of the source follower circuit.

Thereafter, at time t5, the voltage control line 13 is raised to high level. Thereby, the switch transistors 12 is turned on and a BIAS voltage higher than the reset level 29 is applied to the vertical signal line VSL which is in a floating state from the bias voltage generation circuit 5. The voltage of the vertical signal line VSL rises from the reset level 29 to the BIAS voltage. At time t6 after the voltage of the vertical signal line VSL settles to the BIAS voltage, the READ line is raised to high level and held until time t7. In the period from time t6 to time t7, in the unit pixel 2a, the signal charge which is converted and accumulated in the photodiode 20 is read to the FD 25 by the read transistor 21.

At this time, the vertical signal line VSL and the FD 25 are capacity-coupled by a capacity between channels and a wiring capacity of the amplifying transistor 23, so that, in the period from time t5 to time t6, the voltage of the FD 25 increases according to the increase of the voltage of the vertical signal line VSL, and the voltage of the FD 25 rises from the dark-time level 28 toward the BIAS voltage and settles to a voltage near the BIAS voltage. Specifically, the voltage near the BIAS voltage is "voltage of vertical signal line VSL"× "capacity between FD 25 and vertical signal line VSL"÷"total capacity of FD 25".

In the period from time t6 to time t7, while the voltage of the FD 25 is raised to a voltage near the BIAS voltage higher than the dark-time level 28, the signal charge in the photodiode 20 is read to the FD 25. Since the signal charge is electrons, although the voltage of the FD 25 decreases when reading, the voltage of the FD 25 rises to a high level 30 by the capacity coupling between the READ line and the FD 25. At time t7, when the read transistor 21 is turned off, the voltage of the FD 25 falls from the high voltage level 30, to which the voltage has risen, to the BIAS voltage level and settles there.

Thereafter, at time t8, the voltage control line 13 is lowered to low level, the vertical signal line VSL and the bias voltage generation circuit 5 are separated from each other, and the vertical signal line VSL is returned to the floating state. Thereafter, at time t9, the ADDRESS line and the current control line 16 are raised to high level at the same time and held at high level until time 10. In the unit pixel 2a, the amplifying transistor 23 forms a source follower circuit and an operation to convert the voltage of the FD 25 into a pixel signal is started, so that the voltage of the FD 25 falls from the voltage level near the BIAS voltage and settles to a level 31. Similarly, the voltage of the vertical signal line VSL falls from the BIAS voltage level and settles to a level 32. The level 31 is a voltage in which the voltage of the signal charge is added to the voltage of the dark-time level 28. The level 32 is a voltage in which the voltage of the signal charge is added to the voltage of the reset level 29. The pixel signal of the level 32 is input into the column ADC 7.

Next, FIG. 4 illustrates, when the brightness of the subject is higher than a reference value and the dynamic range of the FD 25 is not sufficient, (1) a potential when the signal charge is accumulated in the photodiode (PD) 20, (2) a potential when the signal charge is read while the voltage of the FD 25 is not raised, in other words, while the voltage is still at the dark-time level, and (3) a potential when the signal charge is read after the voltage of the FD 25 is raised as illustrated in the operation example 1.

In FIG. 4 (1), the potential of the photodiode 20 is a potential when the signal charge is accumulated by a certain amount of light. The potential of the FD 25 is approximately at the level of the power source VDD during a period in which the signal charge is accumulated in the photodiode 20. A difference 33 between both potentials determines the charge accumulation capacity of the FD 25 with respect to the converted signal charge amount of the photodiode 20.

As illustrated in FIG. 4 (2), if the signal charge is read by only resetting the FD 25 to the power source voltage VDD, the potential of the FD 25 becomes only slightly higher than the dark-time level which is the power source voltage VDD, and the difference 33 between both potentials is not so large that the relationship of "the charge accumulation capacity of FD 25">"the converted signal charge amount of photodiode 20" is true, so that the dynamic range of the FD 25 is not sufficient. In this case, it is not possible to read all the converted signal charge amount of the photodiode 20 to the FD 25, and signal charge that cannot be read remains in the photodiode 20. Therefore, the signal charge amount is limited by the dynamic range of the FD 25.

On the other hand, as illustrated in FIG. 4 (3), if the voltage of the FD 25 is raised from the dark-time level when reading is performed, it is possible to widen the difference 33 between both potentials so that the relationship of "the charge accumulation capacity of FD 25">"the converted signal charge amount of photodiode 20" is true, so that it is possible to read all the converted signal charge in the photodiode 20 to the FD 25.

As described above, when the brightness of the subject is higher than the reference value and the dynamic range of the FD 25 is not sufficient, the voltage of the FD 25 is raised only when reading is performed so that the dynamic range of the FD 25 is widened and secured. At this time, while the (reset voltage) and the (reset voltage+converted signal voltage) are output to the vertical signal line VSL, the voltage is not raised, so that the voltage raised level of the FD 25 can be changed without considering the operating point of the source follower circuit.

OPERATION EXAMPLE 2

Figure 5:
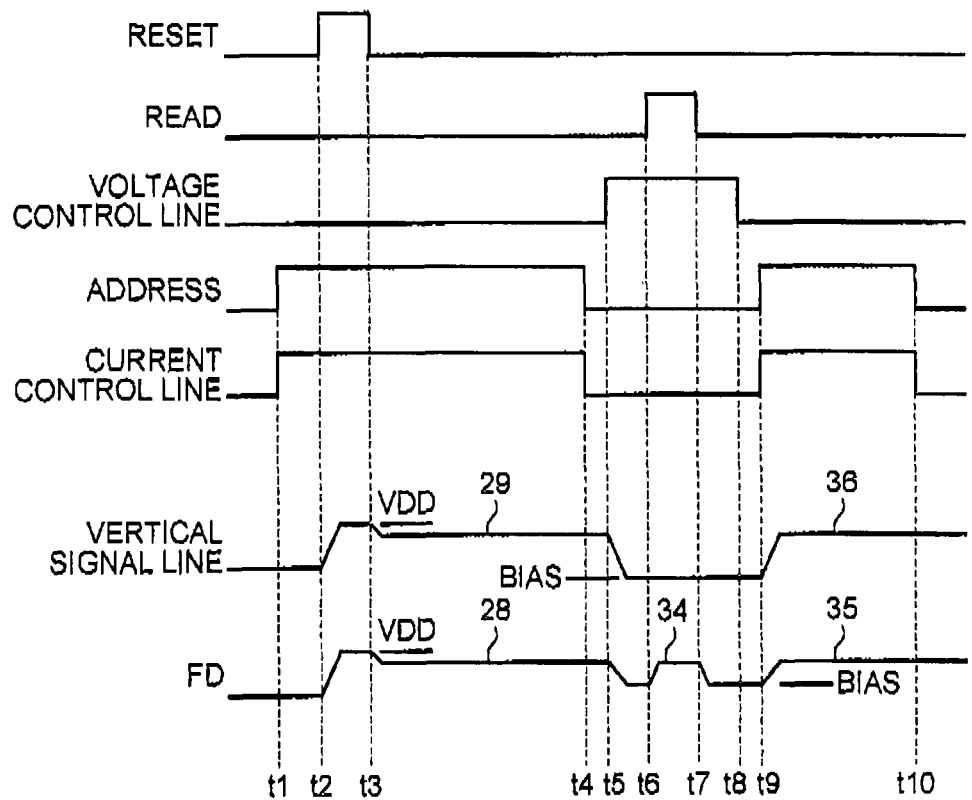
FIG. 5 is a timing chart diagram for explaining a read operation (No. 2) of a converted signal charge to the floating diffusion in a unit pixel.
Figure 6:
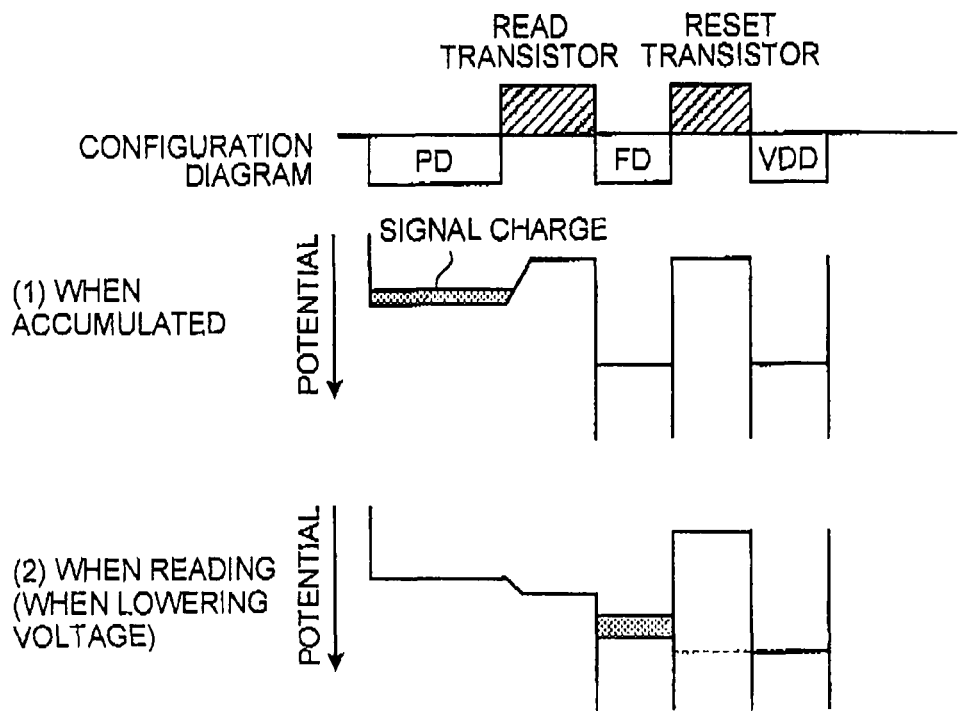
FIG. 6 is a potential diagram for explaining a voltage lowering effect of the floating diffusion.

FIG. 5 is a timing chart diagram for explaining a read operation (No. 2) of a converted signal charge to the floating diffusion in a unit pixel. FIG. 6 is a potential diagram for explaining a voltage lowering effect of the floating diffusion.

The FD 25 and the channel of the read transistor 21 are capacity-coupled by a gate-channel capacity and a wiring capacity, so that the voltage of the FD 25 generally becomes highest when the read line READ is raised to high level and the converted and accumulated signal charge of the photodiode 20 is read. The direction of the electric field generated in the FD 25 is a direction in which a reverse bias voltage that generates a leak current to a substrate is generated, so that if the voltage of the FD 25 is too high, the leak current increases and the leak current causes pixel noises such as white defects due to electric field. Therefore, a method in which the voltage of the FD 25 is raised at all times as in the operation example 1 is not appropriate.

Specifically, when the brightness is higher than the reference value and the dynamic range of the FD 25 is not sufficient, the voltage of the FD 25 has to be raised to widen the dynamic range of the FD 25. However, when the brightness is lower than the reference value, the signal charge amount generated in the photodiode 20 is smaller than the charge accumulation capacity of the FD 25 at the reference light amount, so that the dynamic range of the FD 25 may be narrow. The operation example 2 is a read operation based on such a viewpoint.

In FIG. 5, the reset operation from time t1 to time t4 is the same as that in FIG. 3. The operation in the period (time t4 to time t9) in which the ADDRESS line and the current control line 16 are high level at the same time is different from the operation in FIG. 3. When the brightness of the subject is lower than the reference value, the bias voltage generation circuit 5 generates a bias voltage lower than the reset level 29 which is a "predetermined value", so that, if the voltage control line 13 is raised to high level, the voltage of the vertical signal line VSL falls from the reset level 29 and settles to the BIAS voltage. Similarly, the voltage of the FD 25 falls from the dark-time level 28 and settles to a voltage near the BIAS voltage. Specifically, the voltage near the BIAS voltage is "voltage of vertical signal line VSL"×"capacity between FD 25 and vertical signal line VSL"÷"total capacity of FD 25".

In the period from time t6 to time t7, while the voltage of the FD 25 is lowered to the BIAS voltage lower higher than the dark-time level 28, the signal charge in the photodiode 20 is read to the FD 25. Since the signal charge is electrons, although the voltage of the FD 25 decreases when reading, the voltage of the FD 25 rises to a high level 34 by the capacity coupling between the READ line and the FD 25. However, the voltage level of the level 34 is only slightly higher than the dark-time level 28, so that the problem of the pixel noises due to electric field does not occur. At time t7, when the read transistor 21 is turned off, the voltage of the FD 25 falls from the high voltage level 34, to which the voltage has risen, to a voltage level near the BIAS voltage level and settles there.

Thereafter, at time t8, the voltage control line 13 is lowered to low level, the vertical signal line VSL and the bias voltage generation circuit 5 are separated from each other, and the vertical signal line VSL is returned to the floating state. Thereafter, at time t9, the ADDRESS line and the current control line 16 are raised to high level at the same time and held at high level until time 10. In the unit pixel 2a, the amplifying transistor 23 forms a source follower circuit and an operation to convert the voltage of the FD 25 into a pixel signal is started, so that the voltage of the FD 25 rises from the BIAS voltage level and settles to a level 35. Similarly, the voltage of the vertical signal line VSL rises from the BIAS voltage level and settles to a level 36. The level 35 is a voltage in which the voltage of the signal charge is added to the voltage of the dark-time level 28. The level 36 is a voltage in which the voltage of the signal charge is added to the voltage of the reset level 29. The pixel signal of the level 36 is input into the column ADC 7.

Next, FIG. 6 illustrates, when the brightness of the subject is lower than a reference value and the dynamic range of the FD 25 is sufficient, (1) a potential when the signal charge is accumulated in the photodiode (PD) 20, (2) a potential when the signal charge is read while the voltage of the FD 25 is lowered as in the operation example 2.

In FIG. 6 (1), the potential of the FD 25 is approximately at the level of the power source voltage VDD during a period in which the signal charge is accumulated in the photodiode 20. A potential when the signal charge is accumulated in the photodiode 20 by a certain amount of light is considerably lower than the potential of the FD 25, so that the charge accumulation capacity of the FD 25 is sufficient with respect to the converted signal charge amount of the photodiode 20.

Therefore, as illustrated in FIG. 6 (2), even if the signal charge is read while the voltage of the FD 25 is lowered from the dark-time level when reading is performed and the potential of the FD 25 is set to be lower than the power source voltage, it is possible to establish the relationship of "the charge accumulation capacity of FD 25">"the converted signal charge amount of photodiode 20", so that all the converted signal charge in the photodiode 20 can be read to the FD 25 without problems.

As described above, when the brightness of the subject is lower than the reference value and the dynamic range of the FD 25 is sufficient, the voltage of the FD 25 is lowered when reading is performed, so that the problem of the pixel noises due to electric field can be avoided.

Figure 7:
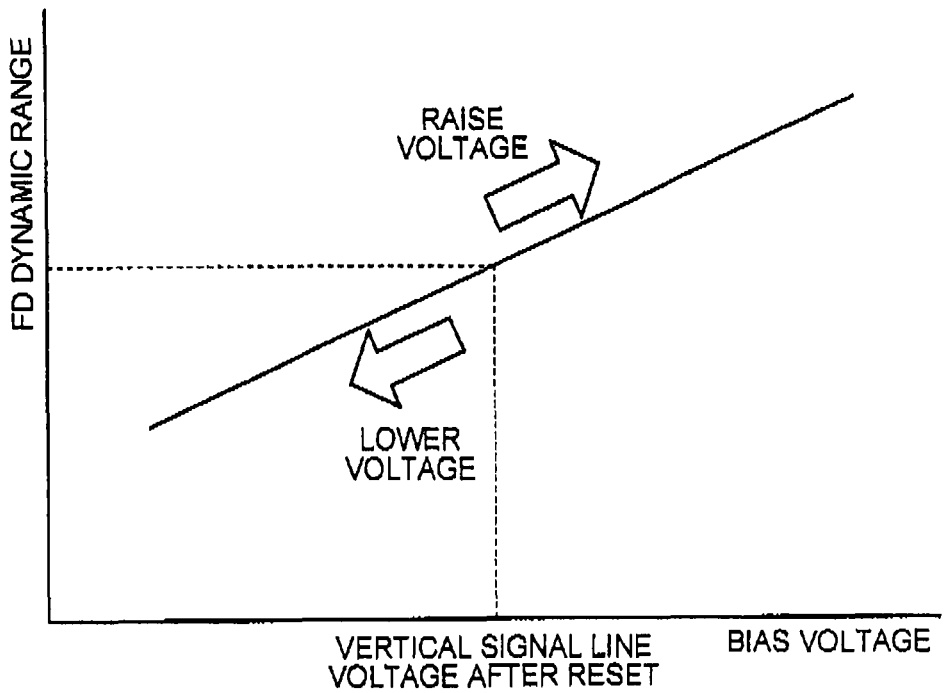
FIG. 7 is a diagram for explaining a relationship between dynamic range of the floating diffusion and bias voltage.
Figure 8:
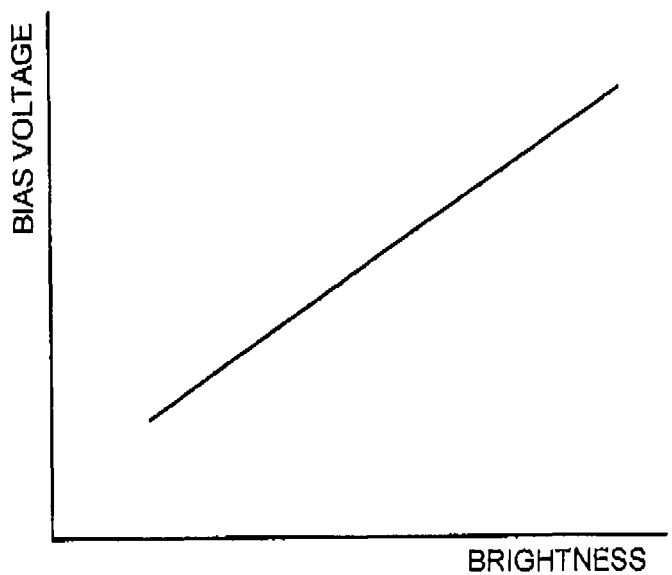
FIG. 8 is a diagram for explaining a relationship between bias voltage and brightness.

In summary, according to the operation examples 1 and 2, in this embodiment, the dynamic range of the FD is controlled as illustrated in FIG. 7 and the bias voltage is controlled as illustrated in FIG. 8.

FIG. 7 is a diagram for explaining a relationship between the dynamic range of the floating diffusion and the bias voltage. In FIG. 7, the vertical axis indicates the FD dynamic range and the horizontal axis indicates the bias (BIAS) voltage. The FD dynamic range at the vertical signal line voltage (which is reset level 29) after the reset (RESET), at which the raised voltage=0, is the reference value that determines the deficiency and excess of the FD dynamic range.

In FIG. 7, if the bias voltage is set to be higher than the vertical signal line voltage after the reset, the voltage of the FD is raised from the dark-time level and the FD dynamic range is widened, so that this setting is applied when the FD dynamic range is not sufficient. On the other hand, if the bias voltage is set to be lower than the vertical signal line voltage after the reset, the voltage of the FD is lowered from the dark-time level and the FD dynamic range is narrowed, so that this setting is applied when the FD dynamic range is sufficient.

FIG. 8 is a diagram for explaining a relationship between the bias voltage and the brightness. In FIG. 8, the vertical axis indicates the bias (BIAS) voltage and the horizontal axis indicates the brightness of the subject. The converted signal charge amount of the photodiode is proportional to the brightness of the subject. Therefore, as illustrated in FIG. 8, the bias voltage generation circuit 5 changes the bias voltage according to the brightness so that the bias voltage is raised when the brightness is higher than the reference value and the bias voltage is lowered when the brightness is lower than the reference value.

Based on this, the dynamic range of the FD can be secured and at the same time the noises due to electric field can be prevented. Here, information related to the brightness is obtained as an analog gain in the operation process of the column ADC 7, so that, in this embodiment, the reference voltage generation circuit 8 outputs the analog gain information 18 to the bias voltage generation circuit 5. When the analog gain is large, the subject is dark, and when the analog gain is small, the subject is bright.

Figure 9:
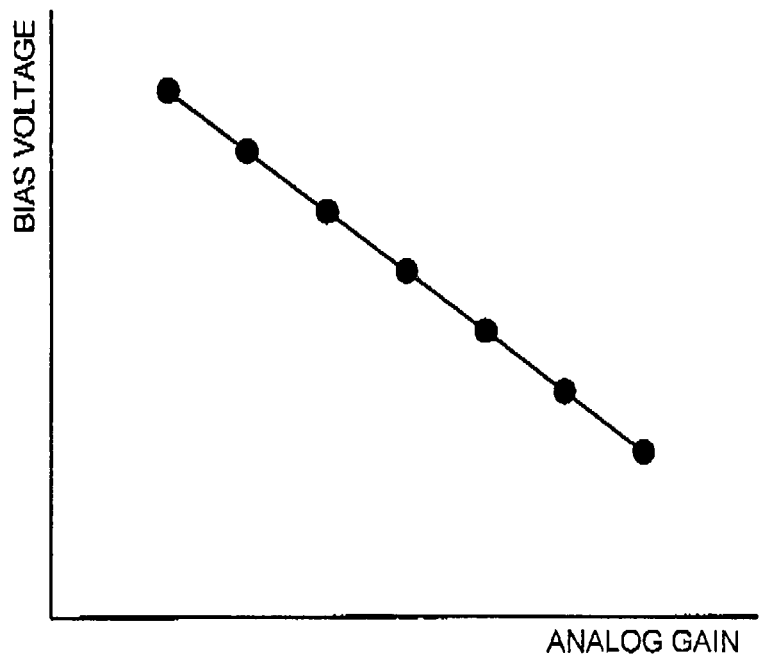
FIG. 9 is a diagram for explaining a relationship between bias voltage and analog gain of column ADC (No. 1)
Figure 10:
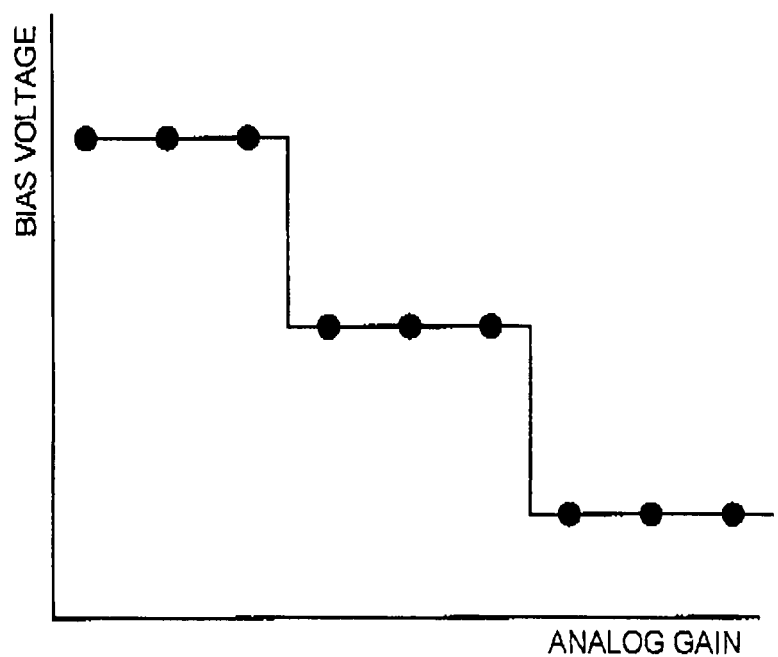
FIG. 10 is a diagram for explaining a relationship between bias voltage and analog gain of column ADC (No. 2).

The bias voltage generation circuit 5 can generate a bias voltage according to the brightness, for example, in a manner as illustrated in FIGS. 9 and 10 by using the analog gain information 18. FIGS. 9 and 10 are diagrams for explaining a relationship between the bias voltage and the analog gain of the column ADC. In FIGS. 9 and 10, the vertical axis indicates the BIAS voltage and the horizontal axis indicates the analog gain.

As illustrated in FIG. 9, the BIAS voltage can be generated so that the BIAS voltage increases and decreases linearly in a one-to-one relationship with one analog gain. As illustrated in FIG. 10, the BIAS voltage can be generated so that the BIAS voltage increases and decreases in a stairs shape in a one-to-one relationship with a plurality of analog gains.

As described above, according to this embodiment, when the signal charge of the photodiode is read to the floating diffusion, if the brightness of the subject is higher than the reference value and the dynamic range of the floating diffusion is not sufficient, a bias voltage higher than the reset level is applied to the vertical signal line to raise the voltage of the floating diffusion higher than the dark-time level and widen the dynamic range of the floating diffusion, so that the dynamic range of the floating diffusion when the signal charge is read can be secured.

On the other hand, when the signal charge of the photodiode is read to the floating diffusion, if the brightness of the subject is lower than the reference value and the dynamic range of the floating diffusion is sufficient, it is not necessary to raise the voltage of the floating diffusion, so that a bias voltage lower than the reset level is applied to the vertical signal line to lower the voltage of the floating diffusion lower than the dark-time level. In this way, when the signal charge is read, the pixel noises due to electric field can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device comprising:
   a pixel array in which a plurality of unit pixels are arranged in row and column directions, each of the unit pixel including a photodiode configured to perform photoelectric conversion, a read transistor configured to read a signal charge converted and accumulated in the photodiode to a floating diffusion, a reset transistor configured to set a voltage of the floating diffusion to a power source voltage, and an amplifying transistor in which the voltage of the floating diffusion is applied to a gate terminal and a power source voltage is applied to a power source terminal when a row of the unit pixel is selected;

a plurality of vertical signal lines that are respectively arranged to columns of the pixel array and respectively connected to an output terminal of the amplifying transistor of each unit pixel in the column direction;

a bias voltage generation circuit configured to generate a bias voltage applied to each of the plurality of vertical signal lines via each of a plurality of first switches;

a plurality of current sources respectively connected between each of the plurality of vertical signal lines and a circuit ground via each of a plurality of second switches; and a pixel driving circuit configured to cause the amplifying transistor to form a source follower circuit, wherein the pixel driving circuit causes the bias voltage generation circuit to generate a bias voltage which is raised or lowered according to brightness of a subject, wherein when the brightness of the subject is lower than a reference value, the pixel driving circuit outputs an instruction to generate a bias voltage lower than a reset voltage of the vertical signal line in a period in which the reset transistor is turned on to the bias voltage generation circuit.

2. The solid-state imaging device according to claim 1, wherein when the pixel driving circuit reads a signal charge from the photodiode to the floating diffusion in each unit pixel in a row of the pixel array, the pixel driving circuit closes the plurality of second switches and causes the amplifying transistor to form a source follower circuit while the plurality of first switches are opened, turns on the reset transistor to connect a power source to the floating diffusion, opens the plurality of second switches to cancel the formed source follower circuit after turning off the reset transistor, closes the plurality of first switches to apply the bias voltage to the plurality of vertical signal lines, turns on the read transistor to read the signal charge to the floating diffusion, and thereafter, closes the plurality of second switches and causes the amplifying transistor to form a source follower circuit while the plurality of first switches are opened.

3. A solid-state imaging device comprising:

a pixel array in which a plurality of unit pixels are arranged in row and column directions, each of the unit pixel including a photodiode configured to perform photoelectric conversion, a read transistor configured to read a signal charge converted and accumulated in the photodiode to a floating diffusion, a reset transistor configured to set a voltage of the floating diffusion to a power source voltage, and an amplifying transistor in which the voltage of the floating diffusion is applied to a gate terminal and a power source voltage is applied to a power source terminal when a row of the unit pixel is selected;

a plurality of vertical signal lines that are respectively arranged to columns of the pixel array and respectively connected to an output terminal of the amplifying transistor of each unit pixel in the column direction;

a bias voltage generation circuit configured to generate a bias voltage applied to each of the plurality of vertical signal lines via each of a plurality of first switches;

a plurality of current sources respectively connected between each of the plurality of vertical signal lines and a circuit ground via each of a plurality of second switches; and a pixel driving circuit configured to cause the amplifying transistor to form a source follower circuit, wherein the pixel driving circuit causes the bias voltage generation circuit to generate a bias voltage which is raised or lowered according to brightness of a subject, wherein when the brightness of the subject is higher than a reference value, the pixel driving circuit outputs an instruction to generate a bias voltage higher than a reset voltage of the vertical signal line in a period in which the reset transistor is turned on to the bias voltage generation circuit.

4. A solid-state imaging device comprising:

a pixel array in which a plurality of unit pixels are arranged in row and column directions, each of the unit pixel including a photodiode configured to perform photoelectric conversion, a read transistor configured to read a signal charge converted and accumulated in the photodiode to a floating diffusion, a reset transistor configured to set a voltage of the floating diffusion to a power source voltage, and an amplifying transistor in which the voltage of the floating diffusion is applied to a gate terminal and a power source voltage is applied to a power source terminal when a row of the unit pixel is selected;

a plurality of vertical signal lines that are respectively arranged to columns of the pixel array and respectively connected to an output terminal of the amplifying transistor of each unit pixel in the column direction;

a bias voltage generation circuit configured to generate a bias voltage applied to each of the plurality of vertical signal lines via each of a plurality of first switches;

a plurality of current sources respectively connected between each of the plurality of vertical signal lines and a circuit ground via each of a plurality of second switches;

a pixel driving circuit configured to, when reading a signal charge from the photodiode to the floating diffusion in each unit pixel in a row of the pixel array, perform a control that closes the plurality of second switches and causes the amplifying transistor to form a source follower circuit while the plurality of first switches are opened, turns on the reset transistor to connect a power source to the floating diffusion, opens the plurality of second switches to cancel the formed source follower circuit after turning off the reset transistor, closes the plurality of first switches to apply the bias voltage to the plurality of vertical signal lines, turns on the read transistor to read the signal charge to the floating diffusion, and thereafter, closes the plurality of second switches and causes the amplifying transistor to form a source follower circuit while the plurality of first switches are opened; and a column ADC configured to perform correlated double sampling processing on a pixel signal output from the floating diffusion to the plurality of vertical signal lines in a period in which the amplifying transistor forms a source follower circuit twice on the basis of two reference signals sequentially input from the pixel driving circuit, digitally convert the processing result into pixel data, and output the pixel data to a processing system, wherein the pixel driving circuit calculates analog gain information that fluctuates according to brightness of a subject from a previous frame output value from the column ADC, and outputs the analog gain information to the bias voltage generation circuit, and the bias voltage generation circuit generates a bias voltage by raising or lowering the bias voltage from a predetermined value in accordance with a comparison result of an analog gain indicated by the analog gain information and a reference value.

5. The solid-state imaging device according to claim 4, wherein the bias voltage generation circuit generates a bias voltage lower than a predetermined value when an analog gain indicated by the analog gain information is larger than the reference value.

6. The solid-state imaging device according to claim 4, wherein the bias voltage generation circuit generates a bias voltage higher than a predetermined value when an analog gain indicated by the analog gain information is smaller than the reference value.

7. The solid-state imaging device according to claim 6, wherein the bias voltage generation circuit generates a bias voltage lower than a predetermined value when an analog gain indicated by the analog gain information is larger than the reference value.

8. The solid-state imaging device according to claim 4, wherein the bias voltage generation circuit generates a bias voltage so that the bias voltage increases and decreases linearly in a one-to-one relationship with one analog gain.

9. The solid-state imaging device according to claim 4, wherein the bias voltage generation circuit generates a bias voltage so that the bias voltage increases and decreases in a stairs shape in a one-to-one relationship with a plurality of analog gains.

* * * * *